(12) United States Patent
Kim et al.

(10) Patent No.: US 10,840,316 B2
(45) Date of Patent: Nov. 17, 2020

(54) ELECTROLUMINESCENT DISPLAY APPARATUS

(71) Applicant: LG Display Co., Ltd., Seoul (KR)

(72) Inventors: YoungMi Kim, Paju-si (KR); Wooram Youn, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/544,154

(22) Filed: Aug. 19, 2019

(65) Prior Publication Data
US 2020/0135818 A1 Apr. 30, 2020

(30) Foreign Application Priority Data
Oct. 29, 2018 (KR) .................. 10-2018-0130159

(51) Int. Cl.
*H01L 27/32* (2006.01)
*H01L 51/52* (2006.01)
*H01L 51/50* (2006.01)
*H01L 27/146* (2006.01)

(52) U.S. Cl.
CPC ...... *H01L 27/3246* (2013.01); *H01L 27/1463* (2013.01); *H01L 27/322* (2013.01); *H01L 51/504* (2013.01); *H01L 51/524* (2013.01); *H01L 51/5275* (2013.01)

(58) Field of Classification Search
None
See application file for complete search history.

(56) References Cited

U.S. PATENT DOCUMENTS

| | | | |
|---|---|---|---|
| 8,288,780 B2 | 10/2012 | Yang et al. | |
| 2010/0309101 A1* | 12/2010 | Kanegae | H01L 27/3246 345/76 |
| 2014/0339523 A1* | 11/2014 | Fukagawa | H01L 51/5246 257/40 |
| 2018/0061907 A1 | 3/2018 | Kim et al. | |
| 2019/0006443 A1* | 1/2019 | Hanashima | H01L 51/0021 |

FOREIGN PATENT DOCUMENTS

| KR | 10-0963076 B1 | 6/2010 |
|---|---|---|
| KR | 10-2018-0025024 A | 3/2018 |

* cited by examiner

*Primary Examiner* — Cheung Lee
(74) *Attorney, Agent, or Firm* — Morgan, Lewis & Bockius LLP

(57) ABSTRACT

An electroluminescent display apparatus includes: a substrate including a first subpixel and a second subpixel; a first electrode in each of the first subpixel and the second subpixel; a partition wall between the first electrode of the first subpixel and the first electrode of the second subpixel; a light emitting layer on the first electrode and the partition wall; a second electrode on the light emitting layer; a first trench between the first electrode of the first subpixel and the partition wall; and a second trench between the first electrode of the second subpixel and the partition wall.

20 Claims, 6 Drawing Sheets

ELECTROLUMINESCENT DISPLAY APPARATUS

This application claims the benefit of and priority to Korean Patent Application No. 10-2018-0130159, filed on Oct. 29, 2018, which is hereby incorporated by reference in its entirety as if fully set forth herein.

BACKGROUND

Technical Field

The present disclosure relates to an electroluminescent display apparatus, and more particularly, to an electroluminescent display apparatus for emitting white light.

Discussion of the Related Art

Electroluminescent display apparatuses include a light emitting layer between two electrodes—an anode electrode and a cathode electrode—and emit light with an electric field generated between the two electrodes, thereby displaying an image. The light emitting layer may be formed of an organic material or an inorganic material such as a quantum dot. In the light emitting layer, an exciton is generated by a combination of an electron and a hole, and when the exciton is shifted from an excited state to a ground state, light is emitted.

The light emitting layer may emit lights of different colors (for example, red, green, and blue) in subpixels, or may emit lights of the same color (for example, white) in the subpixels. Where the light emitting layer emits lights of different colors in subpixels, different light emitting layers may be deposited in subpixels by using a mask. However, a mask process is additionally performed, and a mask may not be precisely aligned. This makes it difficult to deposit the light emitting layer in each subpixel.

On the other hand, where the light emitting layer emits lights of the same color (for example, white light) in subpixels, a mask for forming a pattern of the light emitting layer is not needed, and thus, a problem caused by a mask process does not occur. However, without a mask process, an electric charge moves through the light emitting layer between subpixels adjacent to each other, and thus, a leakage current occurs, causing degradation in image quality.

SUMMARY

Accordingly, the present disclosure is directed to providing an electroluminescent display apparatus that substantially obviates one or more of the above-identified problems due to limitations and disadvantages of the related art.

An aspect of the present disclosure is to provide an electroluminescent display apparatus for decreasing the degradation in image quality caused by a leakage current.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, there is provided an electroluminescent display apparatus, comprising: a substrate including a first subpixel and a second subpixel; a first electrode in each of the first subpixel and the second subpixel; a fence structure between the first electrode of the first subpixel and the first electrode of the second subpixel; a light emitting layer on the first electrode and the fence structure; and a second electrode on the light emitting layer, wherein: the fence structure includes: a first structure arranged in a first direction, a second structure extending from one end of the first structure in a second direction that is different from the first direction, and a third structure extending from another end of the first structure in a third direction that is different from the first direction, and at least a portion of the light emitting layer is disconnected in a region overlapping a trench that is defined by the first structure, the second structure, and the third structure.

Additionally, there is provided an electroluminescent display apparatus, comprising: a substrate including a first subpixel and a second subpixel; a first electrode in each of the first subpixel and the second subpixel; a partition wall between the first electrode of the first subpixel and the first electrode of the second subpixel; a light emitting layer on the first electrode and the partition wall; a second electrode on the light emitting layer; a first trench between the first electrode of the first subpixel and the partition wall; and a second trench between the first electrode of the second subpixel and the partition wall.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate example embodiments of the disclosure and together with the description serve to explain the principle of the disclosure. In the drawings.

DETAILED DESCRIPTION

Figure 1:
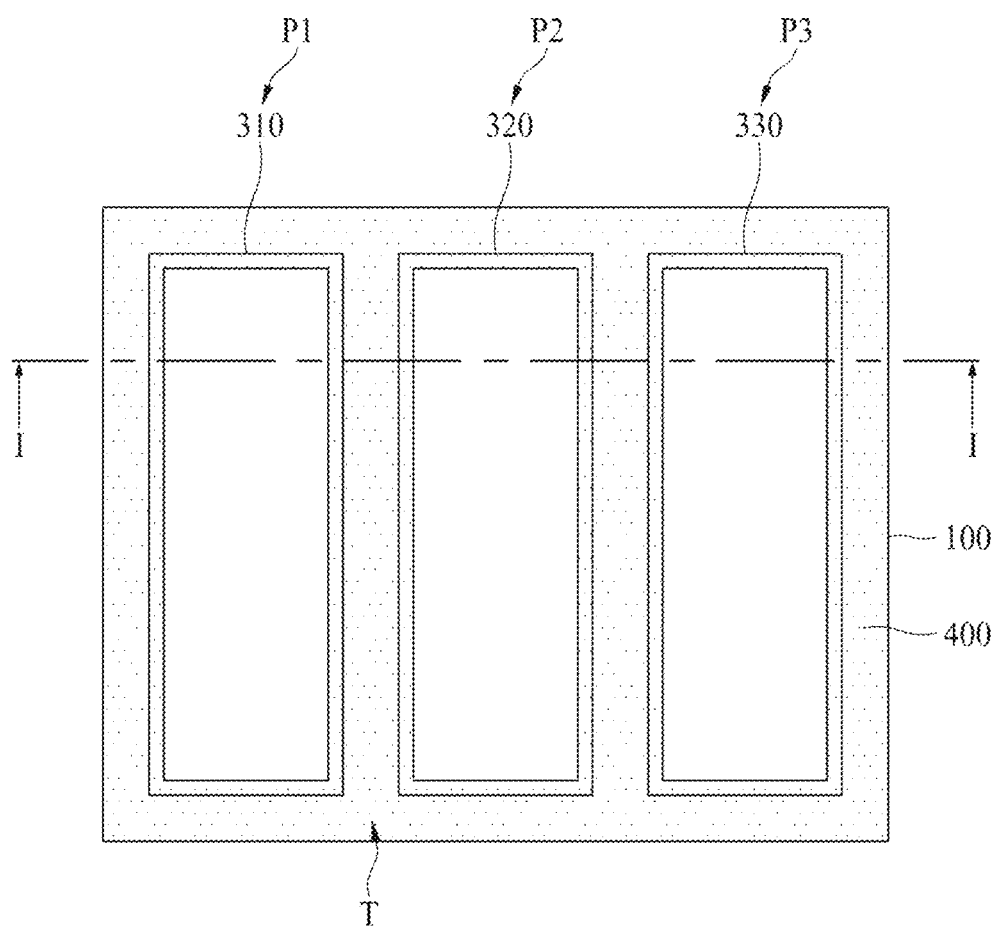
FIG. 1 illustrates an electroluminescent display apparatus according to an example embodiment of the present disclosure.

Reference will now be made in detail to the example embodiments, which may be illustrated in the accompanying drawings. Wherever possible, the same reference numbers will be used throughout the drawings to refer to the same or like parts. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

A shape, a size, a ratio, an angle, and a number disclosed in the drawings for describing example embodiments are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just," or "direct(ly)," is used. In the description of example embodiments, when a structure is described as being positioned "on or above" or "under or below" another structure, this description should be construed as including a case in which the structures contact each other as well as a case in which a third structure is disposed there-between. In describing a time relationship, when the temporal order is described as, for example, "after," "subsequent," "next," and "before," a case that is not continuous may be included unless a more limiting term, such as "just," "immediate(ly)," or "direct (ly)," is used.

It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure. Also, when an element or layer is described as being "connected," "coupled," or "adhered" to another element or layer, the element or layer can not only be directly connected or adhered to that other element or layer. The element or layer can also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item. The size and thickness of each element shown in the drawings are given merely for the convenience of description, and example embodiments are not limited thereto, unless otherwise specified.

Features of various example embodiments may be partially or overall coupled to or combined with each other. Features of various example embodiments may be variously inter-operated with each other and driven technically as those skilled in the art can sufficiently understand. Example embodiments may be carried out independently from each other, or may be carried out together in a co-dependent relationship. Hereinafter, example embodiments of an electroluminescent display apparatus according to the present disclosure will be described in detail with reference to the accompanying drawings.

FIG. 1 illustrates an electroluminescent display apparatus according to an example embodiment of the present disclosure. As illustrated in FIG. 1, the electroluminescent display apparatus may include a substrate 100, a plurality of first electrodes 310, 320 and 330, a fence structure 400, and a trench T. A plurality of subpixels P1 to P3 may be the substrate 100.

The plurality of subpixels P1 to P3 may include a first subpixel P1, a second subpixel P2, and a third subpixel P3. The first subpixel P1, the second subpixel P2, and the third subpixel P3 may be sequentially arranged in a widthwise direction, and thus, the first subpixel P1 and the second subpixel P2 may be disposed adjacent to each other and the second subpixel P2 and the third subpixel P3 may be disposed adjacent to each other. The first subpixel P1 may emit light having one color of red (R), green (G), and blue (B). The second subpixel P2 may emit light having another color of red (R), green (G), and blue (B). The third subpixel P3 may emit light having the other color of red (R), green (G), and blue (B).

The subpixels P1 to P3 emitting lights of the same color may be arranged in one row in a lengthwise direction. An arrangement structure of the plurality of subpixels P1 to P3 may be changed to various structures known to those skilled in the art. The first electrodes 310 to 330 may be respectively patterned in the subpixels P1 to P3. That is, one first electrode 310 may be in the first subpixel P1, one other first electrode 320 may be in the second subpixel P2, and one other first electrode 330 may be in the third subpixel P3. Each of the first electrodes 310 to 330 may function as an anode of the electroluminescent display apparatus. The first electrodes 310 to 330 may be in a tetragonal structure, but are not limited thereto and may be modified into various structures known to those skilled in the art.

The fence structure 400 may be in a boundary region between the plurality of subpixels P1 to P3 to cover edges of the first electrodes 310 to 330. The fence structure 400 may be in the boundary region between the plurality of subpixels P1 to P3 that are vertically and horizontally adjacent to one another, and thus, may be in a wholly matrix structure. An exposure region, which is exposed without being covered by the fence structure 400, of each of the first electrodes 310 to 330 may configure an emission area. The emission area may be defined by the fence structure 400.

The trench T may be in a boundary region between the plurality of subpixels P1 to P3, and in detail, may be in a region between the plurality of first electrodes 310 to 330 adjacent to one another. Like the fence structure 400, the trench T may be in the region between the plurality of first electrodes 310 to 330 that are vertically and horizontally adjacent to one another, and thus, may be in a wholly matrix structure. The trench T may prevent a leakage current from occurring between the subpixels P1 to P3 adjacent to one another. Where an interval between the subpixels P1 to P3 is very short for realizing a high resolution, when light is emitted from a light emitting layer in one of the subpixels P1 to P3, there is a possibility that an electric charge in the light emitting layer may move to an adjacent subpixel to cause a leakage current.

Therefore, in an example embodiment, the trench T may be in a boundary between the subpixels P1 to P3, and thus, a portion of the light emitting layer may be disconnected in a region overlapping the trench T, thereby preventing a leakage current from occurring between the subpixels P1 to P3 adjacent to one another. Because the trench T is in a space between the first electrodes 310 to 330 after the first electrodes 310 to 330 may be patterned, a separate process of forming the trench T may not be needed. Therefore, a boundary region between the subpixels P1 to P3 may not increase for forming the trench T, and an aperture ratio may not decrease. This will be described below in more detail with reference to a below-described cross-sectional view.

Figure 2:
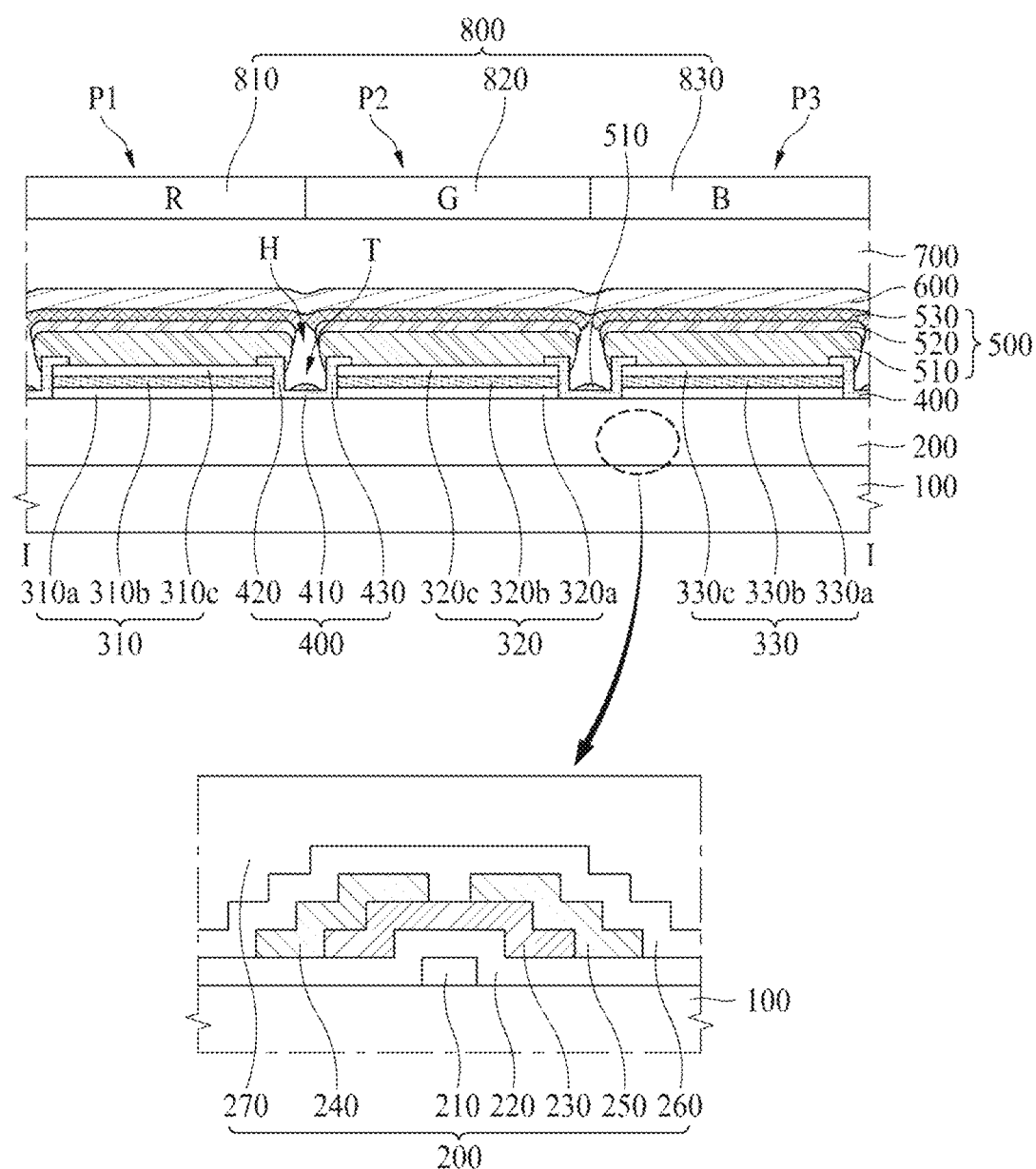
FIG. 2 is a cross-sectional view of an electroluminescent display apparatus according to an example embodiment of the present disclosure.

FIG. 2 is a cross-sectional view of an electroluminescent display apparatus according to an example embodiment of the present disclosure, and corresponds to a cross-sectional surface taken along line I-I of FIG. 1. As illustrated in FIG. 2, the electroluminescent display apparatus according to an example embodiment may include a substrate 100, a circuit device layer 200, a plurality of first electrodes 310 to 330, a fence structure 400, a light emitting layer 500, a second electrode 600, an encapsulation layer 700, and a plurality of color filter layers 810 to 830.

The substrate 100 may be formed of glass, plastic, and/or a semiconductor material such as a silicon wafer. The substrate 100 may be formed of a transparent material or an opaque material. A first subpixel P1, a second subpixel P2, and a third subpixel P3 may be in the substrate 100. The electroluminescent display apparatus according to an example embodiment may be implemented as a top emission type where emitted light is discharged to an upper portion. Accordingly, a material of the substrate 100 may use an opaque material as well as a transparent material.

The circuit device layer 200 may be on the substrate 100. A circuit device including various signal lines, a thin film transistor (TFT), a capacitor, and the like may be in the circuit device layer 200 in each of the first to third subpixels P1 to P3. The signal lines may include a gate line, a data line, a power line, and a reference line, and the TFT may include a switching TFT, a driving TFT, and a sensing TFT. The switching TFT may be turned on according to a gate signal supplied through the gate line and may transfer a data voltage, supplied through the data line, to the driving TFT.

The driving TFT may be turned on with the data voltage supplied through the switching TFT and may generate a data current from power supplied through the power line to supply the data current to the first electrodes 310 to 330. The sensing TFT may sense a threshold voltage deviation of the driving TFT that causes the degradation in image quality and may supply a current of the driving TFT to the reference line in response to a sensing control signal supplied through the gate line or a separate sensing line. The capacitor may hold the data voltage supplied to the driving TFT during one frame and may be connected to a gate terminal and a source terminal of the driving TFT.

Each of the switch TFT, the driving TFT, and the sensing TFT may include a gate electrode 210 on the substrate 100, a gate insulation layer 220 on the gate electrode 210, a semiconductor layer 230 on the gate insulation layer 220, and a source electrode 240 and drain electrode 250 that face each other on the semiconductor layer 230. Each of the switch TFT, the driving TFT, and the sensing TFT may be in a top gate structure in addition to a bottom gate structure, but is not limited thereto and may be changed to various structures known to those skilled in the art.

The circuit device layer 200 may further include a passivation layer 260, on the source electrode 240 and the drain electrode 250, and a planarization layer 270 on the passivation layer 260. The passivation layer 260 may protect the switch TFT, the driving TFT, and the sensing TFT and may be formed of an inorganic insulating material. The planarization layer 270 may planarize an upper surface of the substrate 100 and may be formed of an organic insulating material.

The first electrodes 310 to 330 may be patterned on the circuit device layer 200, and in more detail, may be patterned on the planarization layer 270 in each of the first to third subpixels P1 to P3. The first electrode 310 in the first subpixel P1 may be spaced apart from the first electrode 320 in the second subpixel P2, and a trench T may be in a separation space there-between. Also, the first electrode 320 in the second subpixel P2 may be spaced apart from the first electrode 330 in the third subpixel P3, and a trench T may be in a separation space there-between.

The first electrodes 310 to 330 may be connected to the driving TFT in the circuit device layer 200. In detail, the first electrodes 310 to 330 may be connected to the source electrode 240 or the drain electrode 250 of the driving TFT through a contact hole in the passivation layer 260 and the planarization layer 270. The first electrode 310 of the first subpixel P1 may include a first conductive layer 310a, a second conductive layer 310b, and a third conductive layer 310c. The first electrode 320 of the second subpixel P2 may include a first conductive layer 320a, a second conductive layer 320b, and a third conductive layer 320c. The first electrode 330 of the third subpixel P3 may include a first conductive layer 330a, a second conductive layer 330b, and a third conductive layer 330c.

The first conductive layers 310a to 330a may be between the planarization layer 270 and the second conductive layers 310b to 330b to protect a lower surface of each of the second conductive layers 310b to 330b and to enhance an adhesive force between the first electrodes 310 to 330 and the planarization layer 270. The first conductive layers 310a to 330a may be formed of TiNx.

The second conductive layers 310b to 330b may be between the first conductive layers 310a to 330a and the third conductive layers 310c to 330c and may reflect light, emitted from the light emitting layer 500, to an upper portion. The second conductive layers 310b to 330b may be formed of a reflective material that is better in reflectivity than the first conductive layers 310a to 330a and the third conductive layers 310c to 330c. The electroluminescent display apparatus according to an example embodiment may be implemented as the top emission type, and to this end, the first electrodes 310 to 330 may reflect the light, emitted from the light emitting layer 500, to the upper portion and may include the second conductive layers 310b to 330b so as to reflect light. The second conductive layers 310b to 330b may be formed of aluminum (Al).

The third conductive layers 310c to 330c may be between the second conductive layers 310b to 330b and the light emitting layer 500 and may supply a hole to the light emitting layer 500. The third conductive layers 310c to 330c may be formed of titanium (Ti). The fence structure 400 may be on the circuit device layer 200, and in more detail, may be in a boundary region between the plurality of subpixels P1 to P3 to cover both ends of the first electrodes 310 to 330 on the planarization layer 270. The fence structure 400 may be formed of an inorganic insulating material.

The fence structure 400 may include a first structure 410, a second structure 420, and a third structure 430. A trench T may be defined by the first structure 410, the second structure 420, and the third structure 430. The first structure 410 may be provided in a first direction (in detail, a horizontal direction parallel to the substrate 100), and in detail, may contact an upper surface of the planarization layer 270 in a region between the plurality of first electrodes 310 to 330. Therefore, an upper surface of the first structure 410 may be parallel to the substrate 100. Also, a height of a lower surface of the first structure 410 may be the same as a height of a lower surface of each of the first electrodes 310 to 330.

The second structure 420 may extend from one end of the first structure 410 in a second direction differing from the first direction, and in detail, may extend in an upward direction along one side surface of one of the first electrodes 310 to 330. The second structure 420 may extend from the one side surface to a portion of an upper surface of the one first electrode of the first electrodes 310 to 330, thereby solving a problem that a current concentrates on an end of the one first electrode of the first electrodes 310 to 330 and emission efficiency is reduced.

The third structure 430 may extend from the other end of the first structure 410 in a third direction differing from the first direction, and in detail, may extend in an upward direction along one side surface of one other first electrode adjacent to the one first electrode of the first electrodes 310 to 330. The third direction may be the same as the second direction. One side surface of the one first electrode of the first electrodes 310 to 330 may face one side surface of the one other first electrode of the first electrodes 310 to 330. The third structure 430 may extend from the one side surface to a portion of an upper surface of the one other first electrode of the first electrodes 310 to 330. This solves a problem that a current concentrates on an end of the one other first electrode of the first electrodes 310 to 330, and emission efficiency is reduced.

The first structure 410, the second structure 420, and the third structure 430 may be formed of the same inorganic insulating material and may have the same thickness. The second structure 420 and the third structure 430 may face each other at one end and the other end of the first structure 410 and may extend in an upward direction, and thus, a trench T may be defined by the first structure 410, the second structure 420, and the third structure 430. The trench T may not pass through the fence structure 400 and may be formed in a concave groove structure by the first structure 410, the second structure 420, and the third structure 430.

The trench T is formed by the first structure 410, the second structure 420, and the third structure 430 in a space between the plurality of first electrodes 310 to 330. Therefore, a process of etching the fence structure 400, or the fence structure 400 and the planarization layer 270 thereunder, may not be needed for forming the trench T. As such, an additional process of forming the trench T, and additional cost, may not be needed. Moreover, in a process of etching the fence structure 400, or the fence structure 400 and the planarization layer 270 thereunder, a boundary region between the subpixels P1 to P3 should increase based on a space where the trench T is provided, and thus, an aperture ratio may decrease by the increment. However, according to an example embodiment, the process of etching the fence structure 400 or the fence structure 400 and the planarization layer 270 thereunder may not be needed for forming the trench T, and thus, the boundary region between the subpixels P1 to P3 may not increase, thereby solving a problem where an aperture ratio is reduced.

The trench T may disconnect at least a portion of the light emitting layer 500. At least a portion of the light emitting layer 500 may be disconnected in a region (in more detail, an inner region or upper region of the trench T) overlapping the trench T. Therefore, an electric charge may be prevented from moving between the subpixels P1 to P3 adjacent to one another through the light emitting layer 500, thereby preventing a leakage current from occurring between the subpixels P1 to P3 adjacent to one another.

The light emitting layer 500 may be on the first electrodes 310 to 330 and the fence structure 400. The light emitting layer 500 may also be in the boundary region between the plurality of subpixels P1 to P3. The light emitting layer 500 may emit white (W) light. To this end, the light emitting layer 500 may include a plurality of stacks that emit lights of different colors. In detail, the light emitting layer 500 may include a first stack 510, a second stack 530, and a charge generating layer (CGL) 520 between the first stack 510 and the second stack 530.

The light emitting layer 500 may be in the trench T and above the trench T. According to an example embodiment, at least a portion of the light emitting layer 500 may be disconnected in the trench T or over the trench T, thereby preventing a leakage current from occurring between the subpixels P1 to P3 adjacent to one another. The first stack 510 may be in an inner side surface of the trench T, and moreover, may be in an inner lower surface of the trench T. Therefore, the first stack 510 may be on the first structure 410, the second structure 420, and the third structure 430. A portion (e.g., a portion of the first stack 510 on the second structure 420 and the third structure 430) of the first stack 510 in the inner side surface of the trench T may be disconnected from a portion (e.g., a portion of the first stack 510 on the first structure 410) of the first stack 510 in the inner lower surface of the trench T. Therefore, a portion (e.g., a portion of the first stack 510 on the second structure 420) of the first stack 510 in an inner left surface of the trench T may be disconnected from a portion (e.g., a portion of the first stack 510 on the third structure 430) of the first stack 510 in an inner right surface of the trench T. Accordingly, an electric charge may not move, through the first stack 510, between the subpixels P1 to P3 that are disposed adjacent to one another with the trench T there-between.

Moreover, the charge generating layer 520 may be on the first stack 510 in the inner side surface of the trench T, or may be on the first stack 510 above the trench T without extending to the inner portion of the trench T. In this case, the charge generating layer 520 may be disconnected between the inner left surface of the trench T and the inner right surface of the trench T or between a left upper portion of the trench T and a right upper portion of the trench T. That is, the charge generating layer 520 may be disconnected between the second structure 420 and the third structure 430. Accordingly, an electric charge may not move, through the charge generating layer 520, between the subpixels P1 to P3 that are disposed adjacent to one another with the trench T there-between.

Moreover, the second stack 530 may connect between the subpixels P1 to P3 that are disposed adjacent to one another with the trench T there-between on the charge generating layer 520. Therefore, an electric charge may move, through the second stack 530, between the subpixels P1 to P3 that are disposed adjacent to one another with the trench T there-between. However, the present disclosure is not limited thereto, and by appropriately adjusting a shape of the trench T and a deposition process performed on the light emitting layer 500, the second stack 530 may be disconnected between the subpixels P1 to P3 that are disposed adjacent to one another with the trench T there-between. Only a portion of a lower portion of the second stack 530 adjacent to the charge generating layer 520 may be disconnected in a region between the subpixels P1 to P3.

A void H may be formed in the inner portion of the trench T and an upper region of the trench T by the first stack 510, the charge generating layer 520, and the second stack 530. The void H may be defined by the fence structure 400 and the light emitting layer 500. Therefore, the void H may be under the light emitting layer 500, and may be in a region between the first structure 410 and the second structure 420.

The first stack 510 may be in a structure where a hole injecting layer (HIL), a hole transporting layer (HTL), and a blue (B) emitting layer (EML(B)) are sequentially stacked. The charge generating layer 520 may be between the first stack 510 and the second stack 530 and may provide an electric charge to the first stack 510 and the second stack 530. The charge generating layer 520 may include an N-type charge generating layer for providing an electron to the first stack 510 and a P-type charge generating layer for providing a hole to the second stack 530. The N-type charge generating layer may include a dopant that is a metal material.

The N-type charge generating layer configuring the charge generating layer 520 may include a metal material, and thus, the charge generating layer 520 may be higher in conductivity than the first stack 510 and the second stack 530. Therefore, the movement of an electric charge between the subpixels P1 to P3 disposed adjacent to one another may be performed through the charge generating layer 520, and the amount of electric charges moving through the second stack 530 may be very small. Accordingly, according to an example embodiment, the charge generating layer 520 may be disconnected in the region overlapping the trench T, and thus, may block the movement of an electric charge between the subpixels P1 to P3 disposed adjacent to one another, thereby preventing the occurrence of a leakage current.

The second stack 530 may be on the charge generating layer 520 to have a structure where a hole transporting layer (HTL), a yellowish green (YG) emitting layer (EML(YG)), an electron transporting layer (ETL), and an electron injecting layer (EIL) are sequentially stacked. In the present disclosure, a stacked structure of the first stack 510 and the second stack 530 and a wavelength of light emitted from each of the first stack 510 and the second stack 530 may be changed to various structures known to those skilled in the art.

The second electrode 600 may be on the light emitting layer 500. The second electrode 600 may function as a cathode of the electroluminescent display apparatus. The second electrode 600 may be in each of the subpixels P1 to P3 and a boundary region there-between. Because the electroluminescent display apparatus according to an example embodiment is implemented as the top emission type, the second electrode 600 may include a transparent conductive material for transmitting light, emitted from the light emitting layer 500, toward an upper portion. Also, the second electrode 600 may be a semitransparent electrode, and thus, a micro-cavity effect may be obtained for each of the subpixels P1 to P3. When the second electrode 600 is a semitransparent electrode, reflection and re-reflection of light may be repeated between the second electrode 600 and the first electrodes 310 to 330, and thus, the micro-cavity effect may be obtained, thereby enhancing light efficiency.

The encapsulation layer 700 may be on the second electrode 600 and may prevent external water from penetrating into the light emitting layer 500. The encapsulation layer 700 may be formed of an inorganic insulating material or may be formed in a structure where an inorganic insulating material and an organic insulating material are alternately stacked. The color filter layers 810 to 830 may be on the encapsulation layer 700. The color filter layers 810 to 830 may include a first color filter 810 in the first subpixel P1, a second color filter 820 in the second subpixel P2, and a third color filter 830 in the third subpixel P3. The first color filter 810 may be a color filter having one color of red, green, and blue, the second color filter 820 may be a color filter having one other color of red, green, and blue, and the third color filter 830 may be a color filter having one other color of red, green, and blue. Although not shown, a black matrix may be additionally provided between the color filter layers 810 to 830 and may prevent light from being leaked in a boundary between the subpixels P1 and P2.

Figure 3:
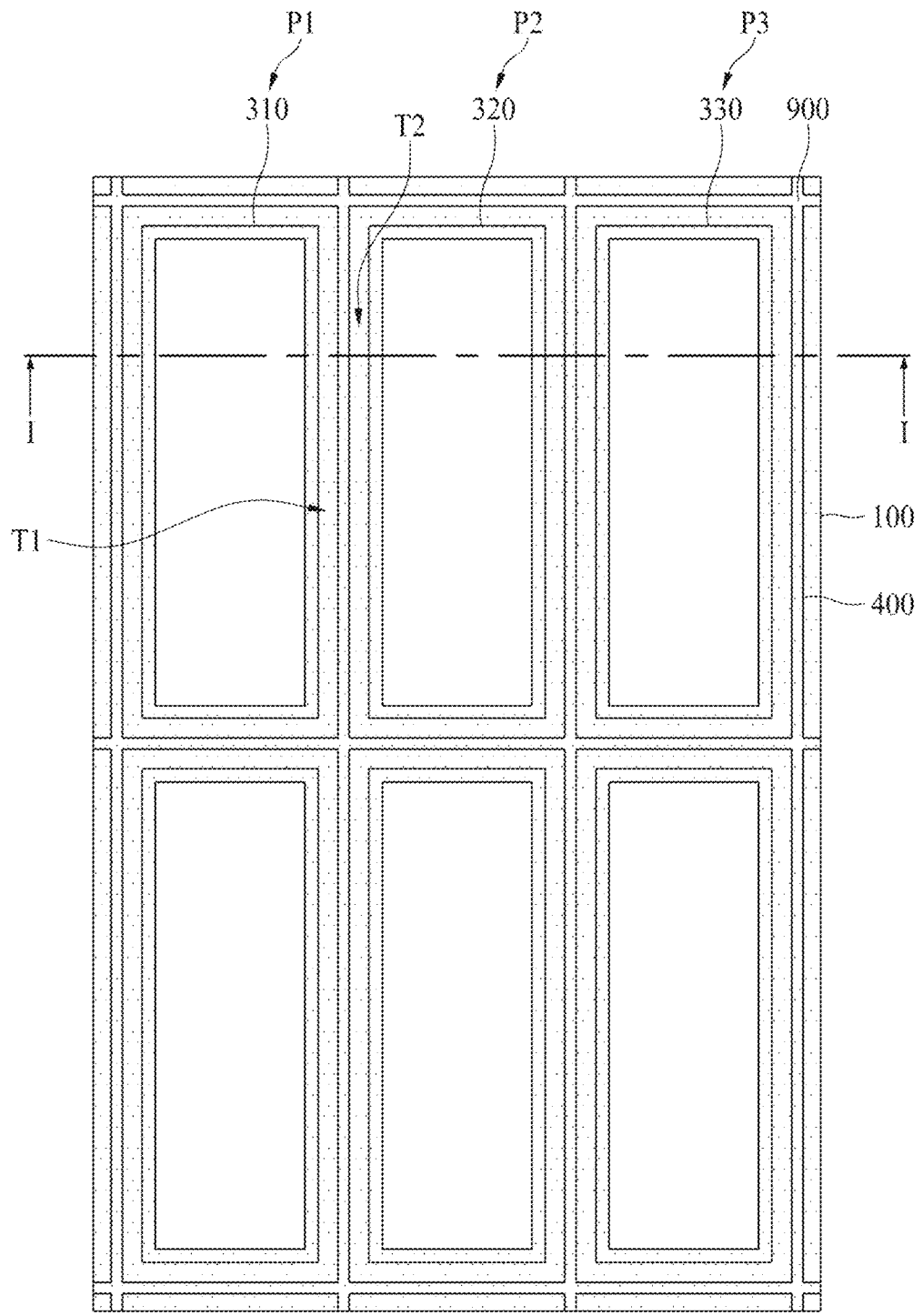
FIG. 3 illustrates an electroluminescent display apparatus according to another example embodiment of the present disclosure.

FIG. 3 illustrates an electroluminescent display apparatus according to another example embodiment of the present disclosure. Except for that a partition wall 900, and a plurality of trenches T1 and T2 are added, the electroluminescent display apparatus of FIG. 3 is the same as the above-described electroluminescent display apparatus of FIG. 1. Therefore, like reference numerals refer to like elements. Hereinafter, only different elements will be described.

As illustrated in FIG. 3, according to another example embodiment, a partition wall 900 may be in a boundary region between a plurality of subpixels (for example, first to third subpixels) P1 to P3. The partition wall 900 may be in a boundary region between a plurality of subpixels P1 to P3 that are vertically and horizontally adjacent to one another, and thus, may be in a wholly matrix structure. The partition wall 900 may be in a region between adjacent first electrodes 310 to 330 not to overlap the first electrodes 310 to 330.

The trenches T1 and T2 may include a first trench T1 and a second trench T2. The first trench T1 may be in a region between one of the first electrodes 310 to 330 and the partition wall 900, and the second trench T2 may be in a region between the partition wall 900 and one other first electrode adjacent to the one first electrode among the first electrodes 310 to 330. For example, the first trench T1 may be in a region between a first electrode 310 of the first subpixel P1 and the partition wall 900, and the second trench T2 may be in a region between a first electrode 310 of the second subpixel P2 and the partition wall 900. Accordingly, the first trench T1 and the second trench T2 may be spaced apart from each other with the partition wall 900 there-between.

Because two trenches (for example, the first and second trenches T1 and T2) separated from each other with the partition wall 900 there-between are in a boundary between the subpixels P1 to P3, a portion of a light emitting layer may be disconnected in at least one of the first trench T1 and the second trench T2. Therefore, a portion of a light emitting layer may be disconnected in the boundary between the subpixels P1 to P3, thereby more certainly preventing the occurrence of a leakage current between the subpixels P1 to P3.

According to another example embodiment, the partition wall 900 may be patterned simultaneously with the first electrodes 310 to 330, and thus, the first trench T1 and the second trench T2 may be in a space between the partition wall 900 and the first electrodes 310 to 330. Accordingly, a separate process of forming the first trench T1 and the second trench T2 may not be needed.

Figure 4:
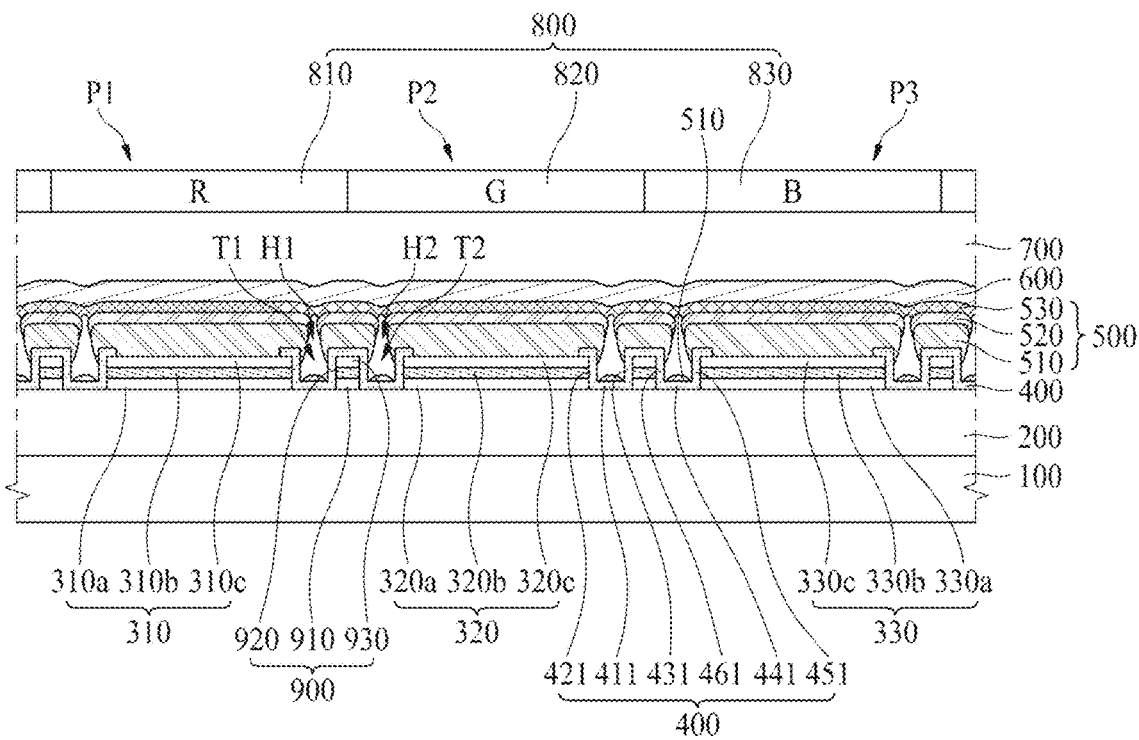
FIG. 4 is a cross-sectional view of an electroluminescent display apparatus according to another example embodiment of the present disclosure.

FIG. 4 is a cross-sectional view of an electroluminescent display apparatus according to another example embodiment of the present disclosure, and corresponds to a cross-sectional surface taken along line I-I of FIG. 3. As illustrated in FIG. 4, the electroluminescent display apparatus according to another example embodiment may include a substrate 100, a circuit device layer 200, a plurality of first electrodes 310 to 330, a partition wall 900, a fence structure 400, a light emitting layer 500, a second electrode 600, an encapsulation layer 700, and a plurality of color filter layers 810 to 830.

The substrate 100, the circuit device layer 200, and the first electrodes 310 to 330 are as described above with reference to FIG. 2, and thus, their repetitive descriptions are omitted. The partition wall 900 may be on the circuit device layer 200, and in more detail, may be in a region between the first electrodes 310 to 330 adjacent to one another on a planarization layer 270. That is, the partition wall 900 may be between a first electrode 310 of a first subpixel P1 and a first electrode 310 of a second subpixel P2 and between the first electrode 310 of the second subpixel P2 and a first electrode 310 of a third subpixel P3. The partition wall 900 may be on the same layer as the first electrodes 310 to 330.

The partition wall 900 may be formed of the same material as that of each of the first electrodes 310 to 330 in the same stacked structure through the same process. The partition wall 900 may include a first layer 910, a second layer 920, and a third layer 930. The first layer 910 of the partition wall 900 may be formed of the same material as that of each of first conductive layers 310a to 330a of the first electrodes 310 to 330 to have the same thickness as that of each of the first conductive layers 310a to 330a. The second layer 920 of the partition wall 900 may be formed of the same material as that of each of second conductive layers 310b to 330b of the first electrodes 310 to 330 to have the same thickness as that of each of the second conductive layers 310b to 330b. The third layer 930 of the partition wall 900 may be formed of the same material as that of each of third conductive layers 310c to 330c of the first electrodes 310 to 330 to have the same thickness as that of each of the third conductive layers 310c to 330c.

The fence structure 400 may include a first structure 411, a second structure 421, a third structure 431, a fourth structure 441, a fifth structure 451, and a sixth structure 461. A first trench T1 may be defined by the first structure 411, the second structure 421, and the third structure 431, and a second trench T2 may be defined by the fourth structure 441, the fifth structure 451, and the sixth structure 461. The first structure 411 may be in a first direction (in detail, a horizontal direction parallel to the substrate 100), and in detail, may contact an upper surface of the planarization layer 270 in a region between the partition wall 900 and one of the first electrodes 310 to 330.

The second structure 421 may extend from one end of the first structure 411 in a second direction differing from the first direction, and in detail, may extend in an upward direction along one side surface of one of the first electrodes 310 to 330. The second structure 421 may extend from the one side surface to a portion of an upper surface of the one first electrode of the first electrodes 310 to 330, thereby solving a problem that a current concentrates on an end of the one first electrode of the first electrodes 310 to 330, and emission efficiency is reduced.

The third structure 431 may extend from the other end of the first structure 411 in a third direction differing from the first direction, and in detail, may extend in an upward direction along one side surface of the partition wall 900. The third direction may be the same as the second direction. One side surface of one of the first electrodes 310 to 330 may face the one side surface of the partition wall 900. The third structure 431 may extend from the one side surface to an upper surface of the partition wall 900, and thus, may be connected to the sixth structure 461.

The first structure 411, the second structure 421, and the third structure 431 may be formed of the same inorganic insulating material and may have the same thickness. The second structure 421 and the third structure 431 may face each other at one end and the other end of the first structure 411 and may extend in an upward direction, and thus, the first trench T1 may be defined by the first structure 411, the second structure 421, and the third structure 431. The fourth structure 441 may be in the first direction (in detail, the horizontal direction parallel to the substrate 100), and in detail, may contact the upper surface of the planarization layer 270 in a region between the partition wall 900 and one other first electrode of the first electrodes 310 to 330.

The fifth structure 451 may extend from one end of the fourth structure 441 in a fifth direction differing from the first direction, and in detail, may extend in an upward direction along one side surface of the one other first electrode of the first electrodes 310 to 330. The fifth structure 451 may extend from the one side surface to a portion of an upper surface of the one other first electrode of the first electrodes 310 to 330, thereby solving a problem that a current concentrates on an end of the one other first electrode of the first electrodes 310 to 330, and emission efficiency is reduced.

The sixth structure 461 may extend from the other end of the fourth structure 441 in a sixth direction differing from the first direction, and in detail, may extend in an upward direction along the other side surface of the partition wall 900. The sixth direction may be the same as the second direction. One side surface of one other first electrode of the first electrodes 310 to 330 may face the other side surface of the partition wall 900. The sixth structure 461 may extend from the other side surface to an upper surface of the partition wall 900, and thus, may be connected to the third structure 431.

The fourth structure 441, the fifth structure 451, and the sixth structure 461 may be formed of the same inorganic insulating material and may have the same thickness. The fifth structure 451 and the sixth structure 461 may face each other at one end and the other end of the fourth structure 441 and may extend in an upward direction, and thus, the second trench T2 may be defined by the fifth structure 451, and the sixth structure 461. As described above, according to another example embodiment, a first trench T1 may be between the first electrode 310 of the first subpixel P1 and the partition wall 900, and a second trench T2 may be between the first electrode 320 of the second subpixel P2 and the partition wall 900. Also, a first trench T1 may be between the first electrode 310 of the second subpixel P2 and the partition wall 900, and a second trench T2 may be between a first electrode 310 of a third subpixel P3 and the partition wall 900.

The first electrodes 310 to 330 and the partition wall 900 may be formed of the same material in the same stacked structure through the same process. The first trench T1 may be formed by the first structure 411, the second structure 421, and the third structure 431 in a space between the one first electrode of the first electrodes 310 to 330 and the partition wall 900. The second trench T2 may be formed by the fourth structure 441, the fifth structure 451, and the sixth structure 461 in a space between the one other first electrode of the first electrodes 310 to 330 and the partition wall 900. Accordingly, a process of etching the fence structure 400 or the fence structure 400 and the planarization layer 270 thereunder may not be needed for forming the first trench T1 and the second trench T2. Therefore, an additional process of forming the first trench T1 and the second trench T2, and additional cost, may not be needed.

The light emitting layer 500, like FIG. 2, may include a first stack 510, a second stack 530, and a charge generating layer 520 between the first stack 510 and the second stack 530. Hereinafter, only a configuration of the light emitting layer 500 differing from FIG. 2 will be described. The light emitting layer 500 may be on the first electrodes 310 to 330, the partition wall 900, and the fence structure 400.

The light emitting layer 500 may be in the first trench T1 and above the first trench T1 and may be in the second trench T2 and above the second trench T2. According to another example embodiment, at least a portion of the light emitting layer 500 may be disconnected in the first trench T1 or above the first trench T1, and may be disconnected in the second trench T2 or above the second trench T2. This prevents a leakage current from occurring between the subpixels P1 to P3 adjacent to one another.

The first stack 510 may be disconnected between an inner left surface and an inner right surface of the first trench T1. That is, the first stack 510 may be disconnected in a region between the second structure 421 and the third structure 431. Also, the first stack 510 may be disconnected between an inner left surface and an inner right surface of the second trench T2. That is, the first stack 510 may be disconnected in a region between the fifth structure 451 and the sixth structure 461. Accordingly, an electric charge may not move, through the first stack 510, between the subpixels P1 to P3 that are disposed adjacent to one another with the first and second trenches T1 and T2 there-between.

The charge generating layer 520 may be disconnected between the inner left surface and the inner right surface of the first trench T1 or between a left upper portion and a right upper portion of the first trench T1. That is, the charge generating layer 520 may be disconnected in the region between the second structure 421 and the third structure 431. Also, the charge generating layer 520 may be disconnected between the inner left surface and the inner right surface of the second trench T2 or between a left upper portion and a right upper portion of the second trench T2. That is, the charge generating layer 520 may be disconnected in the region between the fifth structure 451 and the sixth structure 461. Accordingly, an electric charge may not move, through the charge generating layer 520, between the subpixels P1 to P3 that are disposed adjacent to one another with the first and second trenches T1 and T2 there-between.

The second stack 530 may connect between the subpixels P1 to P3 that are disposed adjacent to one another with the first and second trenches T1 and T2 there-between on the charge generating layer 520. Therefore, an electric charge may move, through the second stack 530, between the subpixels P1 to P3 that are disposed adjacent to one another with the first and second trenches T1 and T2 there-between. However, only a portion of a lower portion of the second stack 530 adjacent to the charge generating layer 520 may be disconnected in a region between the subpixels P1 to P3.

A first void H1 may be formed in the inner portion of the first trench T1 and an upper region of the first trench T1 by the first stack 510, the charge generating layer 520, and the second stack 530. A second void H2 may be formed in the inner portion of the second trench T2 and an upper region of the second trench T2 by the first stack 510, the charge generating layer 520, and the second stack 530. The first void H1 and the second void H2 may be defined by the fence structure 400 and the light emitting layer 500 and may be under the light emitting layer 500. The second electrode 600, the encapsulation layer 700, and the color filter layers 810 to 830 are as described above with reference to FIG. 2, and thus, their repetitive descriptions are omitted.

Figure 5:
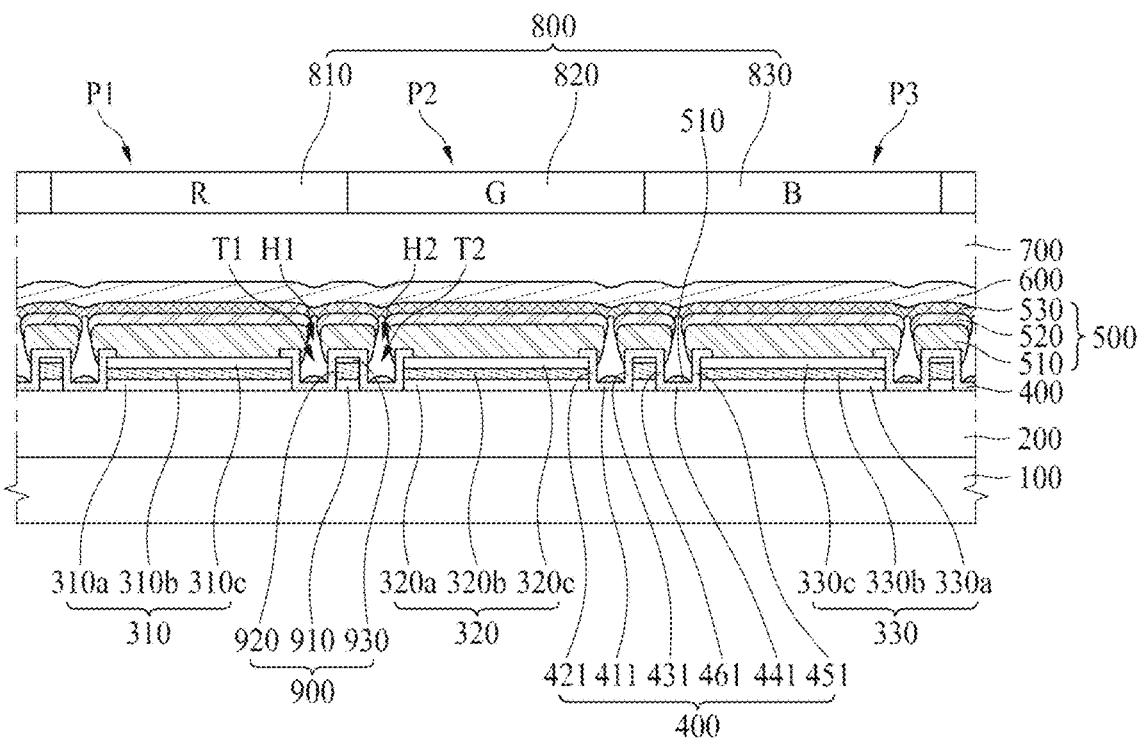
FIG. 5 is a cross-sectional view of an electroluminescent display apparatus according to another example embodiment of the present disclosure.

FIG. 5 is a cross-sectional view of an electroluminescent display apparatus according to another example embodiment of the present disclosure, and corresponds to a cross-sectional surface taken along line I-I of FIG. 3. Except for that a configuration of a partition wall 900 is modified, the electroluminescent display apparatus of FIG. 5 is the same as the above-described electroluminescent display apparatus of FIG. 4, and thus, only different elements will be described below. As illustrated in FIG. 5, a first layer 910 of the partition wall 900 may be formed of the same material as that of each of first conductive layers 310a to 330a of the first electrodes 310 to 330 to have the same thickness as that of each of the first conductive layers 310a to 330a.

A second layer 920 of the partition wall 900 may be formed of the same material as that of each of second conductive layers 310b to 330b of the first electrodes 310 to 330 to have a thickness that is thicker than that of each of the second conductive layers 310b to 330b. The second layer 920 of the partition wall 900 may be formed of a reflective material that is better in reflectivity than the first layer 910 and a third layer 930 of the partition wall 900. Therefore, a thickness of the second layer 920 of the partition wall 900 may be thick, and thus, light reflected by each of the second conductive layers 310b to 330b of the first electrodes 310 to 330 may be reflected to the second layer 920 of the partition wall 900, whereby the amount of light discharged to the inside of the subpixels P1 to P3 may increase. The third layer 930 of the partition wall 900 may be formed of the same material as that of each of third conductive layers 310c to 330c of the first electrodes 310 to 330 to have a thickness that is thinner than that of each of the third conductive layers 310c to 330c. A case where a thickness of each of the first electrodes 310 to 330 is the same as that of the partition wall 900 may be advantage for flattening a substrate.

A thickness of the second layer 920 of the partition wall 900 may be thicker than that of each of second conductive layers 310b to 330b of the first electrodes 310 to 330. Therefore, a thickness of the third layer 930 of the partition wall 900 may be thinner than that of each of third conductive layers 310c to 330c of the first electrodes 310 to 330. As such, a thickness of each of the first electrodes 310 to 330 may be the same as that of the partition wall 900. A difference between a thickness of the second layer 920 of the partition wall 900 and a thickness of each of the second conductive layers 310b to 330b of the first electrodes 310 to 330 may be the same as a difference between a thickness of the third layer 930 of the partition wall 900 and a thickness of each of the third conductive layers 310c to 330c of the first electrodes 310 to 330.

The third layer 930 of the partition wall 900 may be omitted, and a thickness of the second layer 920 of the partition wall 900 may be equal to a sum of a thickness of each of the second conductive layers 310b to 330b of the first electrodes 310 to 330, and a thickness of each of the third conductive layers 310c to 330c of the first electrodes 310 to 330.

Figure 6A:
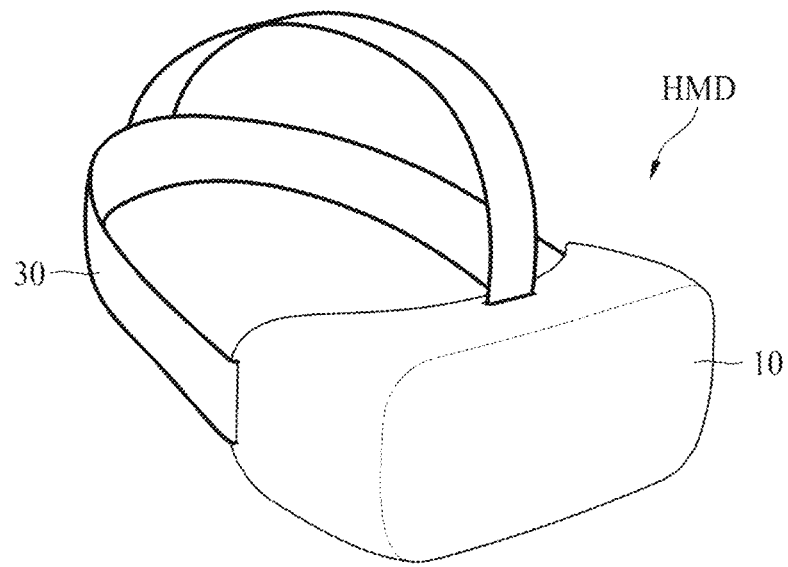
FIGS. 6A to 6C illustrate an electroluminescent display apparatus according to another example embodiment of the present disclosure and a head-mounted display (HMD) apparatus.
Figure 6B:
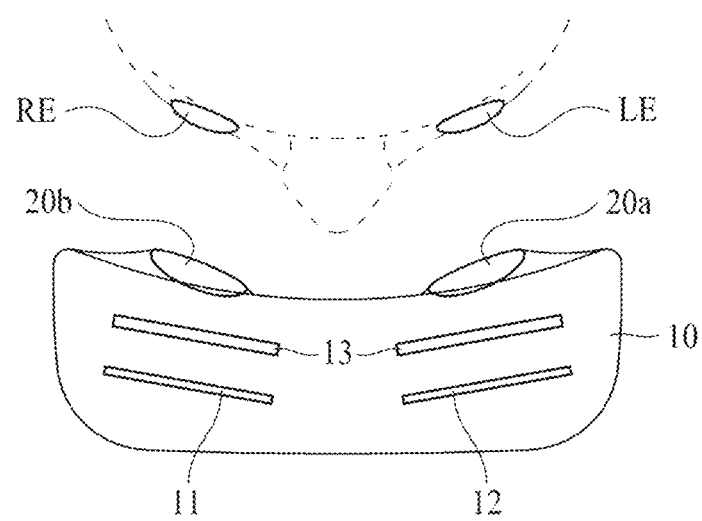
Figure 6C:
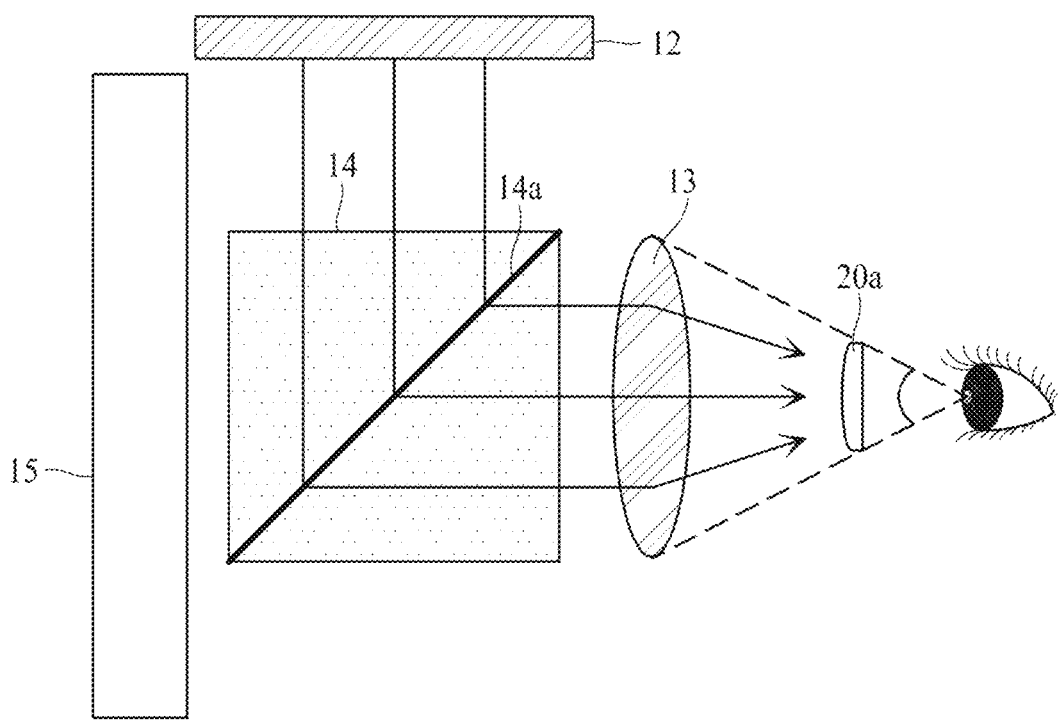

FIGS. 6A to 6C illustrate an electroluminescent display apparatus according to another example embodiment of the present disclosure and a head-mounted display (HMD)

apparatus. FIG. 6A is a schematic perspective view, FIG. 6B is a schematic plan view of a virtual reality (VR) structure, and FIG. 6C is a schematic cross-sectional view of an augmented reality (AR) structure. As illustrated in FIG. 6A, the HMD apparatus according to the present disclosure may include an accommodating case 10 and a head-mounted band 30.

The accommodating case 10 may accommodate elements such as a display apparatus, a lens array, and an eyepiece lens. The head-mounted band 30 may be fixed to the accommodating case 10. The head-mounted band 30 is illustrated as being provided to surround an upper surface of both side surfaces of a user. The head-mounted band 30 may fix the HMD apparatus to a head of a user and may be replaced by a glasses frame type structure or a helmet type structure.

As illustrated in FIG. 6B, an HMD apparatus having the VR structure may include a left-eye display apparatus 12, a right-eye display apparatus 11, a lens array 13, a left-eye eyepiece lens 20a, and a right-eye eyepiece lens 20b. The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus of each of FIGS. 1 to 5. In this case, in FIGS. 1 to 5, an upper portion (for example, color filter layers 810 to 830) corresponding to a surface displaying an image may face the lens array 13.

The lens array 13 may be spaced apart from each of the left-eye eyepiece lens 20a and the left-eye display apparatus 12 and may be between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user. A left eye LE of a user may be located at the left-eye eyepiece lens 20a, and a right eye RE of the user may be located at the right-eye eyepiece lens 20b.

As illustrated in FIG. 6C, an HMD apparatus having the AR structure may include a left-eye display apparatus 12, a lens array 13, a left-eye eyepiece lens 20a, a transmissive reflection part 14, and a transmissive window 15. In FIG. 6C, for convenience, only left-eye elements are illustrated, and right-eye elements may be the same as the left-eye elements. The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15. The left-eye display apparatus 12 may be configured as the electroluminescent display apparatus of each of FIGS. 1 to 5. In this case, in FIGS. 1 to 5, an upper portion (for example, color filter layers 810 to 830) corresponding to a surface displaying an image may face the transmissive reflection part 14.

The lens array 13 may be between the left-eye eyepiece lens 20a and the transmissive reflection part 14. The left eye of the user may be located at the left-eye eyepiece lens 20a. The transmissive reflection part 14 may be disposed between the lens array 13 and the transmissive window 15. The transmissive reflection part 14 may include a reflection surface 14a that transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image that includes a real background and a virtual image, and thus, AR may be implemented.

The transmissive window 15 may be disposed in front of the transmissive reflection part 14. Because a trench is in a boundary region between adjacent subpixels, at least a portion of a light emitting layer may be disconnected in the trench region, and thus, a leakage current may be prevented from occurring between adjacent subpixels, thereby solving a problem where image quality is degraded due to the leakage current.

Moreover, because a trench is in a space between first electrodes, a separate process of forming the trench may not be needed, and moreover, a boundary region between subpixels may not increase for forming the trench, whereby an aperture ratio may not decrease.

The above-described features, structure, and effect of the present disclosure are included in at least one example embodiment, but are not limited to only one example embodiment. Furthermore, the features, structure, and effect described in at least one example embodiment may be implemented through combination or modification of other example embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus, comprising:
   a substrate including a first subpixel and a second subpixel;
   a first electrode in each of the first subpixel and the second subpixel;
   a fence structure between the first electrode of the first subpixel and the first electrode of the second subpixel;
   a light emitting layer on the first electrode and the fence structure; and
   a second electrode on the light emitting layer, wherein:
the fence structure includes: a first structure arranged in a first direction, a second structure extending from one end of the first structure in a second direction that is different from the first direction, and a third structure extending from another end of the first structure in a third direction that is different from the first direction, and
at least a portion of the light emitting layer is disconnected in a region overlapping a trench that is defined by the first structure, the second structure, and the third structure.

2. The electroluminescent display apparatus of claim 1, wherein an upper surface of the first structure is parallel to the substrate.

3. The electroluminescent display apparatus of claim 1, wherein a height of a lower surface of the first structure is the same as a height of a lower surface of the first electrode.

4. The electroluminescent display apparatus of claim 1, wherein:
the second structure and the third structure face each other, and
a void is in a region between the second structure and the third structure.

5. The electroluminescent display apparatus of claim 4, wherein:
the second structure extends to a portion of an upper surface of the first electrode in the first subpixel along a side surface of the first electrode in the first subpixel, and
the third structure extends to a portion of an upper surface of the first electrode in the second subpixel along a side surface of the first electrode in the second subpixel.

6. The electroluminescent display apparatus of claim 1, wherein the trench does not pass through the fence structure.

7. The electroluminescent display apparatus of claim 1, wherein:
the light emitting layer comprises a first stack configured to emit light of a first color, a second stack configured to emit light of a second color that is different from the first color, and a charge generating layer between the first stack and the second stack, and
the first stack and the charge generating layer are disconnected in a region overlapping the trench.

8. The electroluminescent display apparatus of claim 1, further comprising:
a lens array that is spaced apart from the substrate; and
an accommodating case configured to accommodate the substrate and the lens array.

9. An electroluminescent display apparatus comprising:
a substrate including a first subpixel and a second subpixel;
a first electrode in each of the first subpixel and the second subpixel;
a partition wall between the first electrode of the first subpixel and the first electrode of the second subpixel;
a light emitting layer on the first electrode and the partition wall;
a second electrode on the light emitting layer;
a first trench between the first electrode of the first subpixel and the partition wall; and
a second trench between the first electrode of the second subpixel and the partition wall,
wherein at least a portion of the light emitting layer is disconnected in at least one of: a region overlapping the first trench, and a region overlapping the second trench.

10. The electroluminescent display apparatus of claim 9, further comprising a fence structure between the first electrode of the first subpixel and the first electrode of the second subpixel, wherein the fence structure is on the partition wall.

11. The electroluminescent display apparatus of claim 9, wherein a material of the partition wall is the same as a material of the first electrode.

12. The electroluminescent display apparatus of claim 9, wherein:
the first electrode includes a first conductive layer and a second conductive layer that are sequentially stacked,
the partition wall includes a first layer and a second layer that are sequentially stacked, and
the first layer of the partition wall includes a material that is the same as a material of the first conductive layer of the first electrode, and
the second layer of the partition wall includes a material that is the same as a material of the second conductive layer of the first electrode.

13. The electroluminescent display apparatus of claim 12, wherein:
the second layer of the partition wall and the second conductive layer of the first electrode each include a reflective material, and
a thickness of the second layer of the partition wall is greater than a thickness of the second conductive layer of the first electrode.

14. The electroluminescent display apparatus of claim 9, further comprising:
a lens array that is spaced apart from the substrate; and
an accommodating case configured to accommodate the substrate and the lens array.

15. An electroluminescent display apparatus comprising:
a substrate including a first subpixel and a second subpixel;
a first electrode in each of the first subpixel and the second subpixel;
a partition wall between the first electrode of the first subpixel and the first electrode of the second subpixel;
a light emitting layer on the first electrode and the partition wall;
a second electrode on the light emitting layer;
a first trench between the first electrode of the first subpixel and the partition wall;
a second trench between the first electrode of the second subpixel and the partition wall; and
a fence structure between the first electrode of the first subpixel and the first electrode of the second subpixel, wherein the fence structure is on the partition wall,
wherein
the fence structure includes: a first structure that is parallel to the substrate, a second structure extending from one end of the first structure along one side surface of the first electrode of the first subpixel, and a third structure extending from another end of the first structure along one side surface of the partition wall, and
the first trench is defined by the first structure, the second structure, and the third structure.

16. The electroluminescent display apparatus of claim 15, wherein an upper surface of the first structure is parallel to the substrate, and a height of a lower surface of the first structure is the same as a height of a lower surface of the first electrode.

17. The electroluminescent display apparatus of claim 15, wherein:
the second structure and the third structure face each other, and a void is in a region between the second structure and the third structure.

18. The electroluminescent display apparatus of claim 15, wherein:
the fence structure includes: a fourth structure that is parallel to the substrate, a fifth structure extending from one end of the fourth structure along one side surface of the first electrode of the second subpixel, and a sixth structure extending from another end of the fourth structure along another side surface of the partition wall, and
the second trench is defined by the fourth structure, the fifth structure, and the sixth structure.

19. The electroluminescent display apparatus of claim 18, wherein the sixth structure is connected to the third structure in an upper surface of the partition wall.

20. The electroluminescent display apparatus of claim 15, wherein at least a portion of the light emitting layer is disconnected in at least one of: a region overlapping the first trench, and a region overlapping the second trench.

* * * * *